(12) United States Patent
Smith

(10) Patent No.: US 12,080,788 B2
(45) Date of Patent: Sep. 3, 2024

(54) SEMICONDUCTOR DEVICE

(71) Applicant: KABUSHIKI KAISHA TOSHIBA, Tokyo (JP)

(72) Inventor: Matthew David Smith, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 401 days.

(21) Appl. No.: 17/305,349

(22) Filed: Jul. 6, 2021

(65) Prior Publication Data

US 2022/0384631 A1 Dec. 1, 2022

(30) Foreign Application Priority Data

May 25, 2021 (JP) ................................. 2021-087363

(51) Int. Cl.
*H01L 29/778* (2006.01)

(52) U.S. Cl.
CPC ................................ *H01L 29/7787* (2013.01)

(58) Field of Classification Search
CPC .................................................. H01L 29/7787
See application file for complete search history.

(56) References Cited

U.S. PATENT DOCUMENTS

| 9,202,905 | B1 | 12/2015 | Xie et al. |
| 2014/0042579 | A1 | 2/2014 | Chang et al. |
| 2015/0333164 | A1 | 11/2015 | Imada |

(Continued)

FOREIGN PATENT DOCUMENTS

| JP | 2018-120982 A | 8/2018 |
| JP | 2021-009886 A | 1/2021 |
| WO | WO2017221519 A1 * | 12/2017 |

OTHER PUBLICATIONS

Mukai et al., "Gate-Channel Mobility Enhancement by Using AlN Interlayer in Recessed-Gate GaN-MOSFETs", 13$^{th}$ International Conference of Nitride Semiconductors, Jul. 10, 2019, 19 pages.

(Continued)

*Primary Examiner* — Yara B Green
*Assistant Examiner* — William Serrano-Garcia
(74) *Attorney, Agent, or Firm* — Oblon, McClelland, Maier & Neustadt, L.L.P.

(57) ABSTRACT

According to one embodiment, a semiconductor device includes first to third electrodes, a semiconductor member, a first insulating member, and a nitride member. The third electrode includes a first electrode portion. The first electrode portion is between the first and second electrodes. The semiconductor member includes first and second semiconductor regions. The first semiconductor region includes first to fifth partial regions. The second semiconductor region includes first and second semiconductor portions. The first semiconductor portion is electrically connected with the first electrode. The second semiconductor portion is electrically connected with the second electrode. The first insulating member includes a first insulating region. The first insulating region is between the third partial region and the first electrode portion. The nitride member includes a first nitride region. The first nitride region is between the third partial region and the first insulating region, and includes first nitride portions and second nitride portions.

18 Claims, 4 Drawing Sheets

(56) References Cited

U.S. PATENT DOCUMENTS

| | | | |
|---|---|---|---|
| 2018/0097081 A1 | 4/2018 | Cao et al. | |
| 2018/0212046 A1* | 7/2018 | Koyama | H01L 29/1054 |
| 2020/0027976 A1 | 1/2020 | Mukai et al. | |
| 2020/0227542 A1 | 7/2020 | Chu et al. | |
| 2020/0411675 A1* | 12/2020 | Kato | H01L 29/2003 |

OTHER PUBLICATIONS

Zhou et al., "7.6 V Threshold Voltage High-Performance Normally-Off $Al_2O_3$/GaN MOSFET Achieved by Interface Charge Engineering", IEEE Electron Device Letters, vol. 37, No. 2, Feb. 2016, pp. 165-168.

Pampili et al., "InAlN-based LEDs emitting in the near-UV region", Japanese Journal of Applied Physics 58, SCCB33, 2019, 10 pages.

Reuters et al., "Polarization-Engineered Enhancement-Mode High-Electron-Mobility Transistors Using Quaternary AlInGaN Barrier Layers", Journal of Electronic Materials, vol. 42, No. 5, 2013, pp. 826-832.

Ueda et al., "Polarization engineering in GaN power transistors", Physics Status Solidi B 247, No. 7, 2010, pp. 1735-1739.

Smith et al., "Determination of Ga auto-incorporation in nominal InAlN epilayers grown by MOCVD", Journal of Materials Chemistry C, 2, 2014, pp. 5787-5792.

Taylor et al., "Structural and optical properties of Ga auto-incorporated InAlN epilayers", Journal of Crystal Growth 408, 2014, pp. 97-101.

Wei, "Polarization Effects in Group III-Nitride Materials and Devices", Thesis (Ph.D.), Arizona State University, 2012, 133 pages.

Ambacher et al., "Pyroelectric properties of Al(In)GaN/GaN hetero- and quantum well structures", Journal of Physics: Condensed Matter 14, 2002, 37 pages.

Wang et al., "Effects of the wave function localization in AlInGaN quaternary alloys", Applied Physics Letters 91, 061125, 2007, 4 pages.

* cited by examiner

SEMICONDUCTOR DEVICE

CROSS-REFERENCE TO RELATED APPLICATIONS

This application is based upon and claims the benefit of priority from Japanese Patent Application No. 2021-087363, filed on May 25, 2021; the entire contents of which are incorporated herein by reference.

FIELD

Embodiments described herein relates generally to a semiconductor device.

BACKGROUND

For example, there are semiconductor devices such as transistors using nitride semiconductors. Improvement of characteristics is desired in semiconductor devices.

DETAILED DESCRIPTION

Figure 1A:
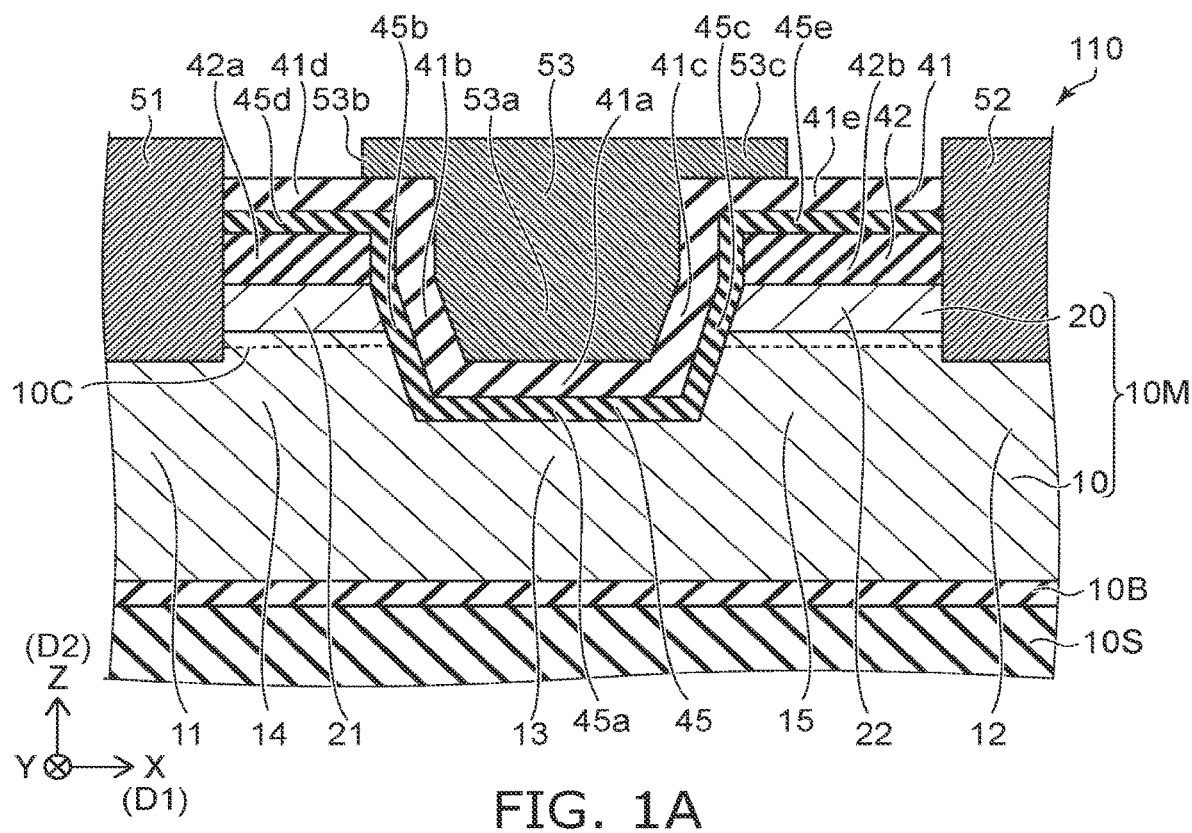
FIGS. 1A and 1B are schematic cross-sectional views illustrating the semiconductor device according to the first embodiment.

According to the embodiment of the present invention, the semiconductor device includes a first electrode, a second electrode, a third electrode, a semiconductor member, a first insulating member, and a nitride member. A direction from the first electrode to the second electrode is along a first direction. The third electrode includes a first electrode portion. A position of the first electrode portion in the first direction is between a position of the first electrode in the first direction and a position of the second electrode in the first direction. The semiconductor member includes a first semiconductor region and a second semiconductor region. The first semiconductor region includes $Al_{x1}Ga_{1-x1}N$ ($0 \le x1 < 1$). The first semiconductor region includes a first partial region, a second partial region, a third partial region, a fourth partial region, and a fifth partial region. A direction from the first partial region to the first electrode, a direction from the second partial region to the second electrode, and a direction from the third partial region to the first electrode portion are along a second direction. The second direction crosses the first direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 < x2 < 1$, $x1 < x2$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first semiconductor portion is electrically connected with the first electrode. The second semiconductor portion is electrically connected with the second electrode. The first insulating member includes a first insulating region. The first insulating region is located between the third partial region and the first electrode portion in the second direction. At least a part of the first insulating region is located between the fourth partial region and the fifth partial region in the first direction. The nitride member includes a first nitride region. The first nitride region is located between the third partial region and the first insulating region in the second direction. The first nitride region includes a plurality of first nitride portions and a plurality of second nitride portions. One of the first nitride portions is between one of the second nitride portions and another one of the second nitride portions in a stacking direction from the semiconductor member to the first electrode portion. A composition of the one of the first nitride portions is different from a composition of the one of the second nitride portions and different from a composition of the other one of the second nitride portions.

First Embodiment

Figure 1B:
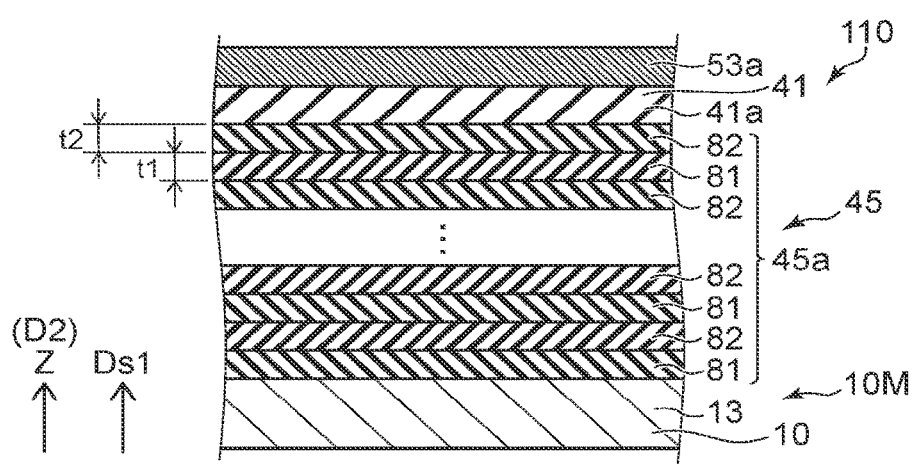

FIGS. 1A and 1B are schematic cross-sectional views illustrating the semiconductor device according to the first embodiment.

FIG. 1B is a cross-sectional view of a part of FIG. 1A.

As shown in FIG. 1A, the semiconductor device 110 according to the embodiment includes a first electrode 51, a second electrode 52, a third electrode 53, a semiconductor member 10M, a first insulating member 41, and a nitride member 45.

A direction from the first electrode 51 to the second electrode 52 is along the first direction D1. The first direction D1 is the X-axis direction. One direction perpendicular to the X-axis direction is defined as the Z-axis direction. The direction perpendicular to the X-axis direction and the Z-axis direction is defined as the Y-axis direction.

The third electrode 53 includes a first electrode portion 53a. A position of the first electrode portion 53a in the first direction D1 is between a position of the first electrode 51 in the first direction D1 and a position of the second electrode 52 in the first direction D1. In one example, at least a part of the first electrode portion 53a is provided between the first electrode 51 and the second electrode 52 in the first direction D1.

The semiconductor member 10M includes a first semiconductor region 10 and a second semiconductor region 20. In this example, the semiconductor device 110 includes a substrate 10S and a nitride semiconductor layer 10B. The substrate 10S may be, for example, a silicon substrate or a SiC substrate. The nitride semiconductor layer 10B includes a nitride semiconductor. The nitride semiconductor layer 10B may include an AlN layer, an AlGaN layer, or the like. The nitride semiconductor layer 10B is provided on the substrate 10S. The first semiconductor region 10 is provided on the nitride semiconductor layer 10B. The second semiconductor region 20 is provided on a part of the first semiconductor region 10. The first electrode 51, the second electrode 52, and the third electrode 53 are provided on another part of the first semiconductor region 10.

The first semiconductor region 10 includes $Al_{x1}Ga_{1-x1}N$ ($0 \le x1 < 1$). The composition ratio x1 is, for example, not less than 0 and less than 0.1. In one example, the first semiconductor region 10 is a GaN layer.

The first semiconductor region 10 includes a first partial region 11, a second partial region 12, a third partial region 13, a fourth partial region 14, and a fifth partial region 15. A direction from the first partial region 11 to the first electrode 51 is along the second direction D2. The second direction D2 crosses the first direction D1. The second direction D2 may be perpendicular to the first direction D1. The second direction D2 is, for example, the Z-axis direction.

A direction from the second partial region 12 to the second electrode 52 is along the second direction D2. A direction from the third partial region 13 to the first electrode portion 53a is along the second direction D2. The first partial region 11 is a region of the first semiconductor region 10 overlapping the first electrode 51 in the second direction D2. The second partial region 12 is a region of the first semiconductor region 10 overlapping the second electrode 52 in the second direction D2. The third partial region 13 is a region of the first semiconductor region 10 overlapping the third electrode 53 in the second direction D2.

A position of the fourth partial region 14 in the first direction D1 is between the position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1. For example, at least a part of the fourth partial region 14 is between the first partial region 11 and the third partial region 13 in the first direction D1. For example, at least a part of the fifth partial region 15 is between the third partial region 13 and the second partial region 12 in the first direction D1.

The second semiconductor region 20 includes $Al_{x2}Ga_{1-x2}N$ ($0<x2<1$, $x1<x2$). The composition ratio x2 is, for example, more than 0 and not more than 0.8. The second semiconductor region 20 is, for example, an AlGaN layer.

The second semiconductor region 20 includes a first semiconductor portion 21 and a second semiconductor portion 22. A direction from the fourth partial region 14 to the first semiconductor portion 21 is along the second direction D2. A direction from the fifth partial region 15 to the second semiconductor portion 22 is along the second direction D2. The first semiconductor portion 21 is electrically connected with the first electrode 51. The second semiconductor portion 22 is electrically connected with the second electrode 52.

The first insulating member 41 includes a first insulating region 41a. The first insulating region 41a is located between the third partial region 13 and the first electrode portion 53a in the second direction D2. At least a part of the first insulating region 41a is between the fourth partial region 14 and the fifth partial region 15 in the first direction D1.

In this example, a part of the first electrode portion 53a is located between the fourth partial region 14 and the fifth partial region 15 in the first direction D1. In this example, another part of the first electrode portion 53a is located between the first semiconductor portion 21 and the second semiconductor portion 22 in the first direction D1. For example, the first electrode portion 53a is embedded in a recess portion provided in the semiconductor member 10M.

A distance between the first electrode 51 and the third electrode 53 is shorter than a distance between the third electrode 53 and the second electrode 52.

A current flowing between the first electrode 51 and the second electrode 52 can be controlled by a potential of the third electrode 53. The potential of the third electrode 53 is, for example, a potential based on the potential of the first electrode 51. The first electrode 51 functions as, for example, a source electrode. The second electrode 52 functions as, for example, a drain electrode. The third electrode 53 functions as, for example, a gate electrode. The semiconductor device 110 is, for example, a transistor.

A carrier region 10C is provided at a portion of the first semiconductor region 10 in contact with the second semiconductor region 20. The carrier region 10C is, for example, a two-dimensional electron gas. The semiconductor device 110 is, for example, HEMT (High Electron Mobility Transistor). The third electrode 53 is, for example, a recess type gate electrode.

In the embodiment, the nitride member 45 is provided. The nitride member 45 includes a first nitride region 45a. The first nitride region 45a is provided between the third partial region 13 and the first insulating region 41a in the second direction D2.

FIG. 1B illustrates a region including the first nitride region 45a. The nitride member 45 includes a plurality of first nitride portions 81 and a plurality of second nitride portions 82. The direction from the semiconductor member 10M to the first electrode portion 53a is defined as a stacking direction Ds1. In the first nitride region 45a, the stacking direction Ds1 is along the second direction D2 (for example, the Z-axis direction).

One of the plurality of first nitride portions 81 is between one of the plurality of second nitride portions 82 and another one of the plurality of the second nitride portions 82. A composition of the one of the first nitride portions 81 is different from a composition of the one of the second nitride portions 82. The composition of the one of the first nitride portions 81 is different from a composition of the other one of the second nitride portions 82.

For example, in the stacking direction Ds1, the one of the second nitride portions 82 is between the one of the first nitride portions 81 and another one of the first nitride portions 81. The composition of the one of the first nitride portions 81 is different from the composition of the one of the second nitride portions 82. The composition of the other one of the first nitride portions 81 is different from the composition of the other one of the second nitride portions 82.

For example, the one of the first nitride portions 81 includes $In_{y1}Al_{z1}Ga_{1-y1-z1}N$ ($0 \le y1 \le 1$, $0 \le z1 \le 1$, $y1+z1 \le 1$). The one of the second nitride portions 82 includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ge z1$).

For example, each of the first nitride portions 81 includes $In_{y1}Al_{z1}Ga_{1-y1-z1}N$ ($0 \le y1 \le 1$, $0 \le z1 \le 1$, $y1+z1 \le 1$). Each of the second nitride portions 82 includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ne z1$).

In one example, each of the first nitride portions 81 is an AlN film. Each of the second nitride portions 82 is an InGaN film. In the embodiment, the position and material of the first nitride portion 81 may be replaced with the position and material of the second nitride portion 82. For example, in the nitride member 45, AlN films and InGaN films are alternately provided. In the nitride member 45, a stacking layer structure including a plurality of films having different compositions is provided.

With such a nitride member 45, for example, an appropriate dipole is formed in a region between the semiconductor member 10M and the first insulating member 41. For example, a negative fixed charge is formed. This makes it easier to obtain a high threshold voltage. For example, by providing the nitride member 45, scattering of carriers is suppressed in the carrier region 10C. High mobility can be easily obtained. For example, a low on-resistance is obtained. According to the embodiment, a semiconductor device capable of improving the characteristics is provided.

As shown in FIG. 1A, in this example, the first insulating member 41 includes a second insulating region 41b and a third insulating region 41c. At least a part of the second insulating region 41b is located between the first semiconductor portion 21 and the first electrode portion 53a in the first direction D1. At least a part of the third insulating region 41c is located between the first electrode portion 53a and the second semiconductor portion 22 in the first direction D1.

The nitride member 45 includes a second nitride region 45b and a third nitride region 45c. At least a part of the second nitride region 45b is located between the first semiconductor portion 21 and the at least the part of the second insulating region 41b in the first direction D1. At least a part of the third nitride region 45c is located between the at least the part of the third insulation region 41c and the second semiconductor portion 22 in the first direction D1. The second nitride region 45b and the third nitride region 45c correspond to the side surfaces of the first electrode portion 53a.

Figure 2A:
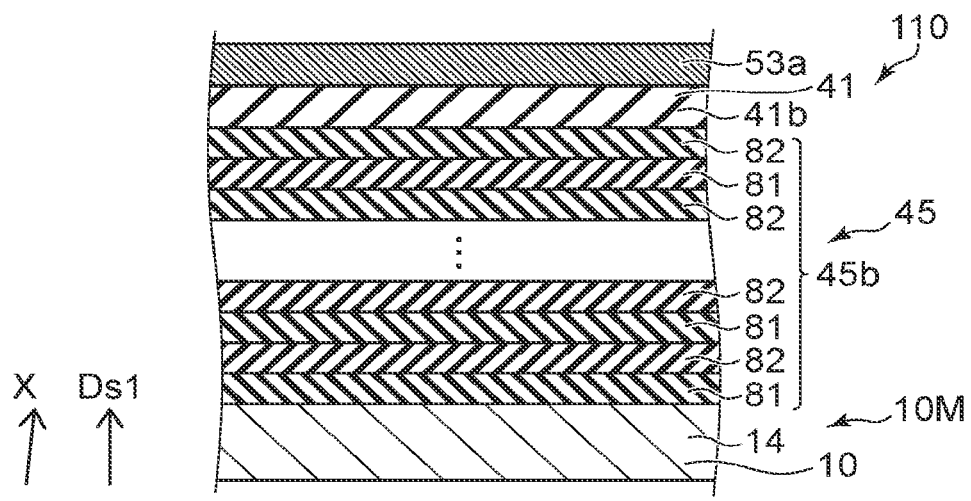
FIGS. 2A and 2B are schematic cross-sectional views illustrating a part of the semiconductor device according to the first embodiment.
Figure 2B:
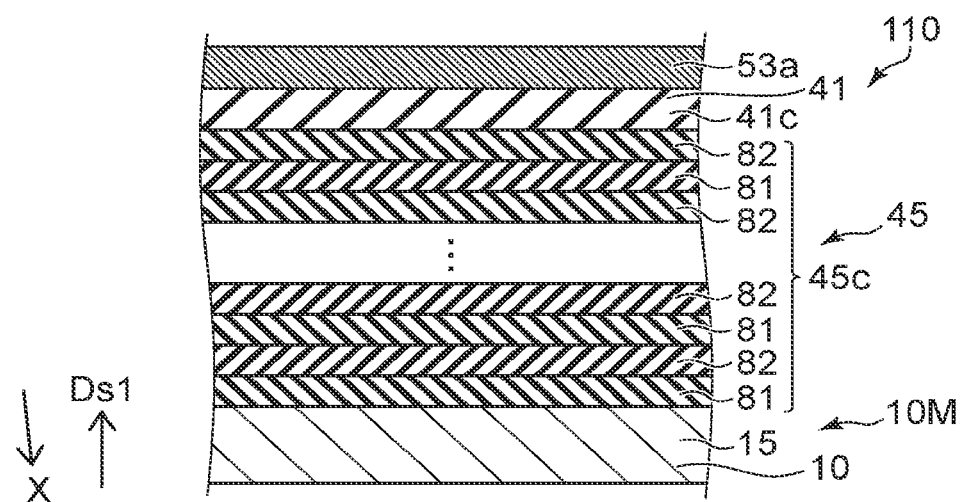

FIGS. 2A and 2B are schematic cross-sectional views illustrating a part of the semiconductor device according to the first embodiment.

FIG. 2A illustrates a region including the second nitride region 45b. FIG. 2B illustrates a region including the third nitride region 45c. In the second nitride region 45b, the nitride member 45 includes the first nitride portions 81 and the second nitride portions 82. In the third nitride region 45c, the nitride member 45 includes the first nitride portions 81 and the plurality of second nitride portions 82. As described above, the above-mentioned stacking layer structure may be provided also in the second nitride region 45b and the third nitride region 45c.

In the second nitride region 45b and the third nitride region 45c, the stacking direction Ds1 is along the X-axis direction (first direction D1). When the side wall of the recess provided in the semiconductor member 10M is inclined, the stacking direction Ds1 in the second nitride region 45b and the third nitride region 45c may be inclined with respect to the X-axis direction. The first nitride portions 81 and the second nitride portions 82 may be conformally formed in the recess.

As shown in FIG. 1A, the nitride member 45 may include a fourth nitride region 45d and a fifth nitride region 45e. The first semiconductor portion 21 is located between the fourth partial region 14 and the fourth nitride region 45d in the second direction D2. The second semiconductor portion 22 is located between the fifth partial region 15 and the fifth nitride region 45e in the second direction D2.

As shown in FIG. 1A, in this example, the second insulating member 42 is provided. The second insulating member 42 includes a first insulating portion 42a and a second insulating portion 42b. The first semiconductor portion 21 is located between the fourth partial region 14 and the first insulating portion 42a in the second direction D2. The second semiconductor portion 22 is located between the fifth partial region 15 and the second insulating portion 42b in the second direction D2.

For example, the first semiconductor portion 21 is located between the fourth partial region 14 and the fourth insulating region 41d in the second direction D2. The first insulating portion 42a is located between the first semiconductor portion 21 and the fourth insulating region 41d in the second direction D2. The fourth nitride region 45d is located between the first insulating portion 42a and the fourth insulating region 41d in the second direction D2.

For example, the second semiconductor portion 22 is located between the fifth partial region 15 and the fifth insulating region 41e in the second direction D2. The second insulating portion 42b is located between the second semiconductor portion 22 and the fifth insulating region 41e in the second direction D2. The fifth nitride region 45e is located between the second insulating portion 42b and the fifth insulating region 41e in the second direction D2.

For example, the first insulating member 41 comprises silicon and oxygen. The second insulating member 42 comprises silicon and nitrogen. The first insulating member 41 does not comprise nitrogen. Alternatively, a concentration of nitrogen in the first insulating member 41 is lower than a concentration of nitrogen in the second insulating member 42. The second insulating member 42 does not comprise oxygen. Alternatively, an oxygen concentration in the second insulating member 42 is lower than an oxygen concentration in the first insulating member 41.

The first insulating member 41 comprises, for example, silicon oxide (for example, $SiO_2$). The second insulating member 42 comprises, for example, silicon nitride (for example, SiN). By providing the second insulating member 42 comprising nitrogen on the semiconductor member 10M, it becomes easy to obtain stable characteristics in the semiconductor member 10M.

In this example, the third electrode 53 includes a second electrode portion 53b and a third electrode portion 53c. A part of the first insulating member 41 may be provided between the semiconductor member 10M and the second electrode portion 53b in the second direction D2. A part of the nitride member 45 may be provided between the semiconductor member 10M and the second electrode portion 53b in the second direction D2. A part of the first insulating member 41 may be provided between the semiconductor member 10M and the third electrode portion 53c in the second direction D2. A part of the nitride member 45 may be provided between the semiconductor member 10M and the third electrode portion 53c in the second direction D2.

Hereinafter, examples of the nitride member 45 will be described. As shown in FIG. 1B, each of the plurality of the first nitride portions 81 has a first thickness t1 along the stacking direction Ds1. Each of the plurality of the second nitride portions 82 has a second thickness t2 along the stacking direction Ds1. The first thickness t1 and the second thickness t2 may be appropriately determined.

In the embodiment, the thickness of each of the first nitride portions 81 (the first thickness t1) is, for example, not less than 0.1 nm and not more than 5 nm. The thickness of each of the second nitride portions 82 (the second thickness t2) is not less than 0.1 nm and not more than 5 nm. For example, these thicknesses are not less than a thickness of a monatomic layer. A uniform film is obtained. When these thicknesses are not more than 5 nm, good crystallinity can be easily obtained in the nitride member 45.

For example, a crystal lattice in the one of the first nitride portions 81 is continuous with a crystal lattice in the one of the second nitride portions 82. The crystal lattice in the one of the first nitride portions 81 is continuous with the crystal lattice in the other one of the second nitride portions 82. The nitride member 45 may be, for example, a superlattice layer. The nitride member 45 may be, for example, an InAlGaN digital alloy layer.

For example, a crystal lattice in the first nitride region 45a may be continuous with a crystal lattice in the third partial region 13. The crystal lattice of the nitride member 45 may be continuous with, for example, the crystal lattice of the first semiconductor region 10. Good crystallinity can be obtained. High mobility can easily be to obtained. Good characteristics can be obtained.

In the first semiconductor region 10 (for example, the third partial region 13), the c-axis direction aligns substantially along the second direction D2 (for example, the Z-axis direction). An angle between the c-axis direction and the second direction D2 may be not less than 0 degrees and not more than 8 degrees. In one example, the angle may be about 4 degrees.

A case where the nitride member 45 includes two types of nitride portions (the first nitride portions 81 and the second nitride portions 82) will be described. Each of the first nitride portions 81 includes $In_{y1}Al_{z1}Ga_{1-y1-z1}N$ ($0 \leq y1 \leq 1$, $0 \leq z1 \leq 1$, $y1+z1 \leq 1$). Each of the second nitride portions 82 includes $In_{y2}Al_{z2}Ga_{1-y2-z2}N$ ($0 \leq y2 \leq 1$, $0 \leq z2 \leq 1$, $y2+z2 \leq 1$, $y2 \neq y1$, $z2 \neq z1$). Each of the first nitride portions 81 has the first thickness t1 along the stacking direction Ds1. Each of the second nitride portions 82 has the second thickness t2 along the stacking direction Ds1. The number of the first nitride portions 81 is n1 (n1 is an integer not less than 2). The number of the second nitride portions 81 is n2 (n2 is an integer not less than 2). For example, n2 may be n1, n1+1, or n1−1.

An average composition of the nitride member 45 is represented by $In_\alpha Al_\beta Ga_{1-\alpha-\beta}N$ ($0 \leq \alpha \leq 1$, $0 \leq \beta \leq 1$, $\alpha+\beta \leq 1$). The composition ratio $\alpha$ is $(t1 \times y1 \times n1 + t2 \times y2 \times n2)/(t1 \times n1 + t2 \times n2)$. The composition ratio $\beta$ is $(t1 \times z1 \times n1 + t2 \times z2 \times n2)/(t1 \times n1 + t2 \times n2)$.

As will be described later, the average composition of the nitride member 45 may be set so as to match the characteristics of the first semiconductor region 10.

Second Embodiment

Figure 3A:
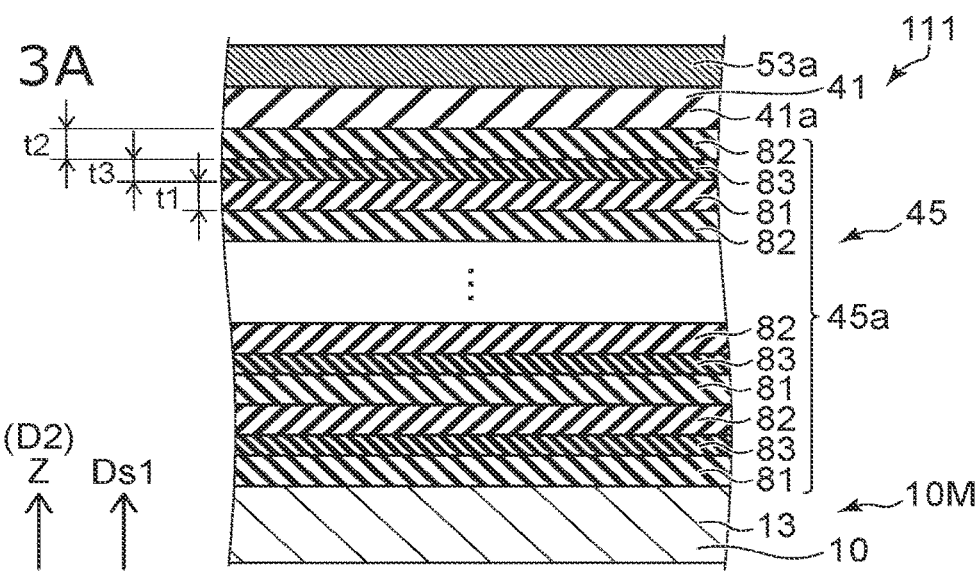
FIGS. 3A to 3C are schematic cross-sectional views illustrating a part of the semiconductor device according to the second embodiment.
Figure 3B:
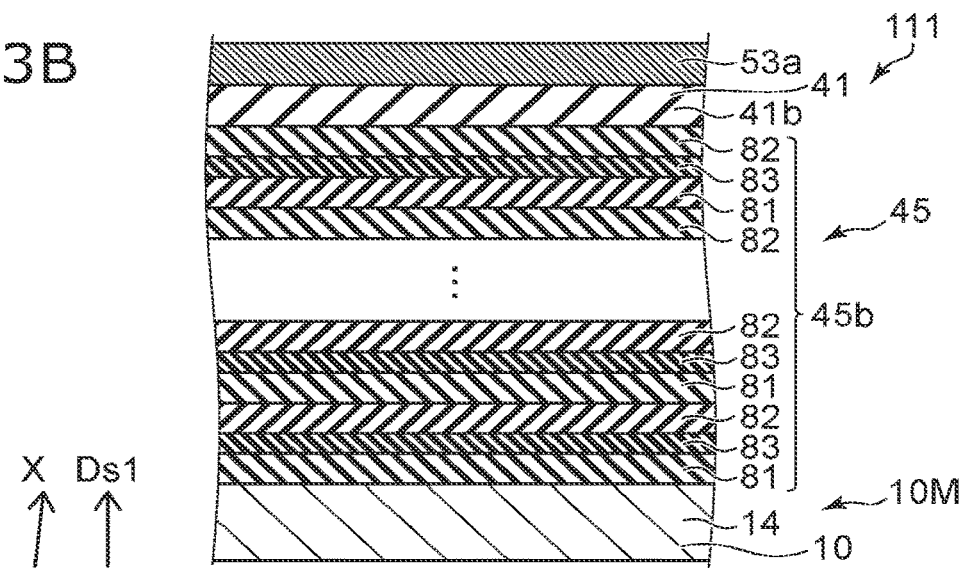
Figure 3C:
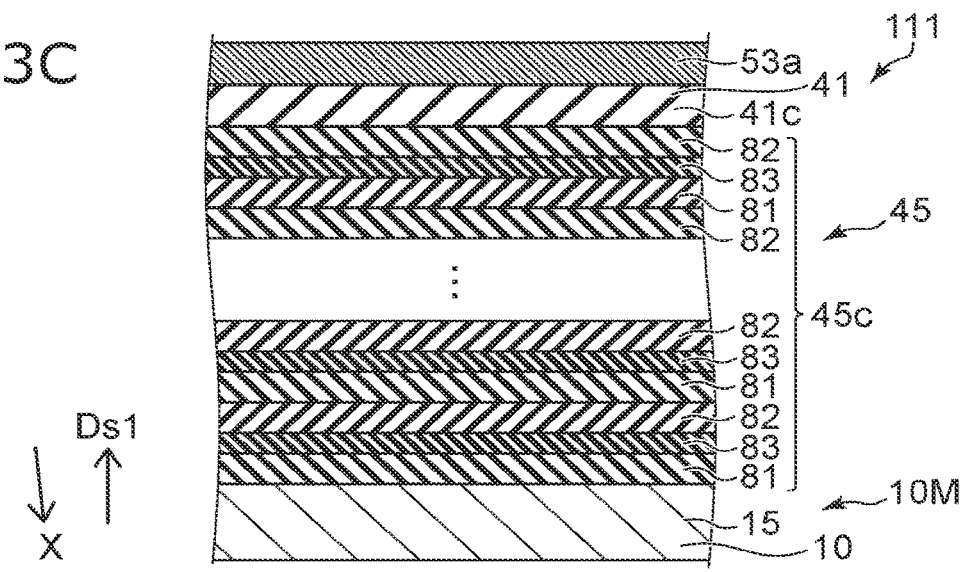

FIGS. 3A to 3C are schematic cross-sectional views illustrating a part of the semiconductor device according to the second embodiment.

These figures correspond to regions including the first to third nitride regions 45a to 45c, respectively. The semiconductor device 111 according to the embodiment also includes a first electrode 51, a second electrode 52, a third electrode 53, a semiconductor member 10M, a first insulating member 41, and a nitride member 45. The configuration of the nitride member 45 in the semiconductor device 111 is different from the configuration of the nitride member 45 in the semiconductor device 110. Except for this, the configuration of the semiconductor device 111 may be the same as the configuration of the semiconductor device 110.

As shown in FIG. 3A, in the semiconductor device 111, the nitride member 45 includes the first nitride portions 81, the second nitride portions 82, and a third nitride portion 83. The number of the third nitride portions 83 may be one. Alternatively, the number of the third nitride portions 83 may be not less than two.

The third nitride portion 83 is provided between the one of the first nitride portions 81 and the one of the second nitride portions 82 in the stacking direction Ds1. A composition of the third nitride portion 83 is different from the composition of the one of the first nitride portions 81. The composition of the third nitride portion 83 is different from the composition of the one of the second nitride portions 82.

The composition of the third nitride portion 83 is different from the composition of the other one of the second nitride portions 82.

When the nitride member 45 includes multiple third nitride portions 83, one of the third nitride portions 83 is provided between the one of the first nitride portions 81 and the one of the second nitride portions 82 in the stacking direction Ds1. The composition of the one of the third nitride portions 83 is different from the composition of the one of the first nitride portions 81. The composition of the one of the third nitride portions 83 is different from the composition of the one of the second nitride portions 82. The composition of the one of the third nitride portions 83 is different from the composition of the other one of the second nitride portions 82.

In one example, the first nitride portion 81 is an AlN film. The second nitride portion 82 is an InN film. The third nitride portion 83 is a GaN film. Such a stacked layer structure is provided in the first nitride region 45a of the nitride member 45. This can form, for example, an appropriate dipole. For example, a negative fixed charge is formed. This makes it easier to obtain a high threshold voltage. For example, carrier scattering is suppressed, and high mobility can be easily obtained. For example, a low on-resistance is obtained. According to the embodiment, a semiconductor device capable of improving the characteristics is provided.

As shown in FIG. 3A, the third nitride portion 83 has a thickness (a third thickness t3) along the stacking direction Ds1. The first thickness t1, the second thickness t2, and the third thickness t3 may be appropriately determined. In the embodiment, the third thickness t3 is, for example, not less than 0.1 nm and not more than 5 nm. A uniform film is obtained. When the thickness is not more than 5 nm, good crystallinity can be easily obtained.

A case where the nitride member 45 includes three types of nitride portions (for example, the first nitride portions 81, the second nitride portions 82, and the third nitride portion 83) will be described. Each of the first nitride portions 81 includes $In_{y1}Al_{z1}Ga_{1-y1-z1}N$ ($0 \leq y1 \leq 1$, $0 \leq z1 \leq 1$, $y1+z1 \leq 1$). Each of the second nitride portions 82 includes $In_{y2}Al_{z2}Ga_{1-y2-z2}N$ ($0 \leq y2 \leq 1$, $0 \leq z2 \leq 1$, $y2+y2 \leq 1$, $y2 \neq y1$, $z2 \neq z1$). Each of the one or more third nitride portions 83 includes $In_{y3}Al_{z3}Ga_{1-y3-z3}N$ ($0 \leq y3 \leq 1$, $0 \leq z3 \leq 1$, $y3+z3 \leq 1$, $y3 \neq y1$, $y3 \neq y2$, $z3 \neq z1$, $z3. \neq z2$). Each of the first nitride portions 81 has the first thickness t1 along the stacking direction Ds1. Each of the second nitride portions 82 has the second thickness t2 along the stacking direction Ds1. Each of the one or more third nitride portions 83 has the third thickness t3 along the stacking direction. The number of the first nitride portions 81 is n1 (n1 is an integer not less than of 2). The number of the second nitride portions 82 is n2 (n2 is an integer not less than 2). The number of the one or more third nitride portions is n3 (n3 is an integer not less than 1).

The nitride member 45 includes $In_\alpha Al_\beta Ga_{1-\alpha-\beta}N$ ($0 \leq \alpha \leq 1$, $0 \leq \beta \leq 1$, $\alpha+\beta \leq 1$). $In_\alpha Al_\beta Ga_{1-\alpha-\beta}N$ ($0 \leq \alpha \leq 1$, $0 \leq \beta \leq 1$, $\alpha+\beta \leq 1$) corresponds to the average composition of the nitride member 45. The composition ratio $\alpha$ is $(t1 \times y1 \times n1 + t2 \times y2 \times n2 + t3 \times y3 \times n3)/(t1 \times n1 + t2 \times n2 + t3 \times n3)$. The composition ratio $\beta$ is $(t1 \times z1 \times n1 + t2 \times z2 \times n2 + t3 \times z3 \times n3)/(t1 \times n1 + t2 \times n2 + t3 \times n3)$.

When the number of the plurality of types of nitride portions provided on the nitride member 45 is 4 or more, the average composition of the nitride member 45 may be defined in the same way as described above. For example, two types of nitride members can be integrated in the same way as described above, and they can be further integrated. Thereby, the average composition can be derived for the nitride member 45 including any number of types of nitride portions. As will be described later, the average composition of the nitride member 45 may be set so as to match the characteristics of the first semiconductor region 10.

Hereinafter, examples of the average composition of the nitride member 45 will be described. In the following example, the first semiconductor region 10 is a GaN layer. The average composition of the nitride member 45 is $In_\alpha Al_\beta Ga_{1-\alpha-\beta}N$ ($0 \leq \alpha \leq 1$, $0 \leq \beta \leq 1$, $\alpha+\beta \leq 1$).

Figure 4:
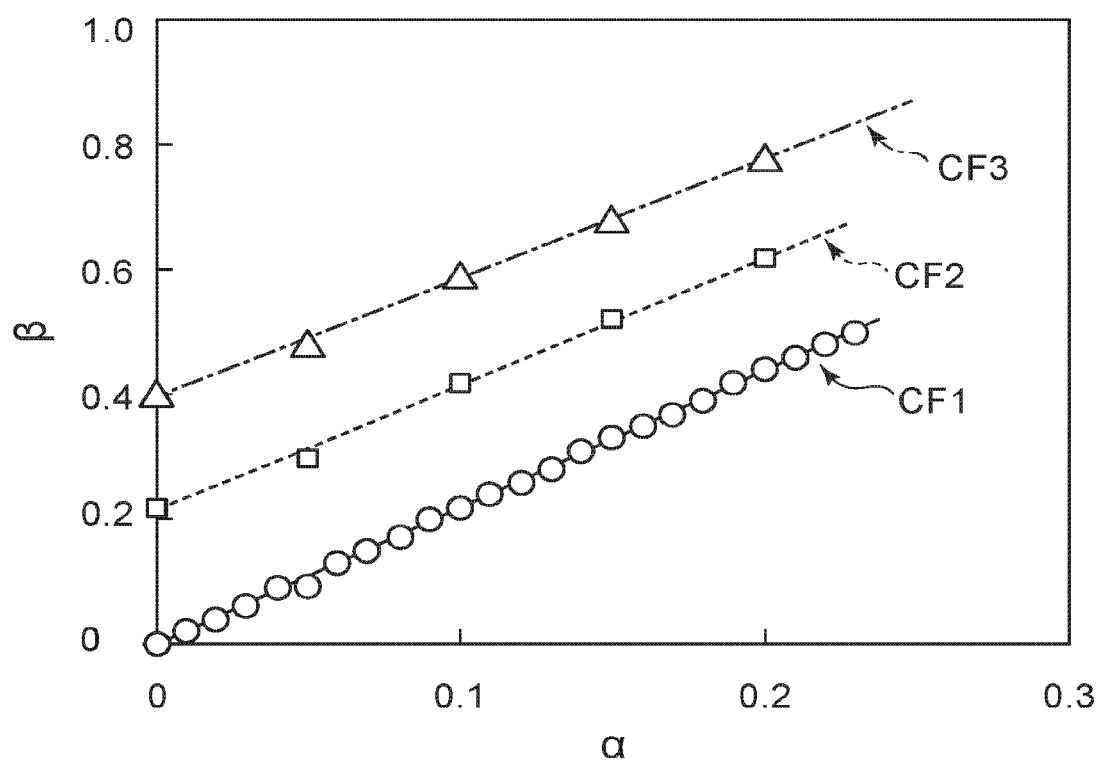
FIG. 4 is a graph illustrating the characteristics of the semiconductor device according to the embodiment.

FIG. 4 is a graph illustrating the characteristics of the semiconductor device according to the embodiment.

The horizontal axis in FIG. 4 corresponds to the composition ratio $\alpha$. The vertical axis corresponds to the composition ratio $\beta$. In the characteristics shown in FIG. 4, lattice mismatch, strain, spontaneous polarization and piezo polarization are taken into consideration in $In_\alpha Al_\beta Ga_{1-\alpha-\beta}N$ and GaN.

FIG. 4 illustrates a first condition CF1, a second condition CF2, and a third condition CF3. In the first condition CF1, the polarization of $In_\alpha Al_\beta Ga_{1-\alpha-\beta}N$ is the same as the polarization of GaN. In the second condition CF2, the polarization of $In_\alpha Al_\beta Ga_{1-\alpha-\beta}N$ is −50% of the polarization of GaN. In the third condition CF3, the polarization of $In_\alpha Al_\beta Ga_{1-\alpha-\beta}N$ is −100% of the polarization of GaN.

In the first condition CF1, $\beta=2.207\times\alpha$. In the second condition CF2, $\beta=2.04\times\alpha+0.212$. In the third condition CF3, $\beta=1.92\times\alpha+0.394$.

In one example of the embodiment, $\alpha$ and $\beta$ are preferable to satisfy:

$$2.207\times\alpha \leq \beta \leq 1.92\times\alpha+0.394.$$

As a result, the polarization of $In_\alpha Al_\beta Ga_{1-\alpha-\beta}N$ becomes in the range of −100% of the polarization of GaN to the polarization of GaN.

In another example of the embodiment, $\alpha$ and $\beta$ are preferable to satisfy:

$$2.207\times\alpha \leq \beta \leq 2.204\times\alpha+0.212.$$

As a result, the polarization of $In_\alpha Al_\beta Ga_{1-\alpha-\beta}N$ becomes in the range of −50% of the polarization of GaN to the polarization of GaN.

Appropriate polarization can be obtained and an appropriate high threshold voltage can be obtained.

In the embodiment, $\alpha$ and $\beta$ are may satisfy:

$$2.207\times\alpha < \beta < 1.92\times\alpha+0.394.$$

In the embodiment, $\alpha$ and $\beta$ are may satisfy:

$$2.207\times\alpha < \beta < 2.204\times\alpha+0.212.$$

In the embodiment, at least one of the first electrode 51 and the second electrode 52 includes, for example, at least one selected from a group consisting of Al, Ti, Ni, Au, Pd, Pt, W, Cu, Si, Ge, Ag, and Sn. The third electrode 53 includes, for example, at least one selected from a group consisting of Ni, Pt, Au, Si, W, Cu, and Sn.

In the embodiment, information concerning the composition of the members may be obtained by, for example, SIMS (Secondary Ion Mass Spectrometry), or the like. Information concerning the crystal lattice may be obtained, for example, by a TEM (Transmission Electron Microscope), X-ray diffraction, or the like.

According to the embodiment, it is possible to provide a semiconductor device having improved characteristics.

In the specification, "nitride semiconductor" includes all compositions of semiconductors of the chemical formula $B_x In_y Al_z Ga_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor members, insulating members, nitride members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first electrode;
    a second electrode, a direction from the first electrode to the second electrode being along a first direction;
    a third electrode including a first electrode portion, a position of the first electrode portion in the first direction being between a position of the first electrode in the first direction and a position of the second electrode in the first direction;
    a semiconductor member including a first semiconductor region and a second semiconductor region,
        the first semiconductor region including $Al_{x1}Ga_{1-x1}N$ ($0 \leq x1 < 1$), the first semiconductor region includes a first partial region, a second partial region, a third partial region, a fourth partial region, and a fifth partial region, a direction from the first partial region to the first electrode, a direction from the second partial region to the second electrode, and a direction from the third partial region to the first electrode portion being along a second direction, the second direction crossing the first direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, and the second semiconductor region including $Al_{x2}Ga_{1-x2}N$ ($0<x2<1$, $x1<x2$), the second semiconductor region including a first semiconductor portion and a second semiconductor portion, a direction from the fourth partial region to the first semiconductor portion being along the second direction, a direction from the fifth partial region to the second semiconductor portion being along the second direction, the first semiconductor portion being electrically connected with the first electrode, the second semiconductor portion being electrically connected with the second electrode;

a first insulating member including a first insulating region, the first insulating region being located between the third partial region and the first electrode portion in the second direction, at least a part of the first insulating region being located between the fourth partial region and the fifth partial region in the first direction; and a nitride member including a first nitride region, the first nitride region being located between the third partial region and the first insulating region in the second direction, the first nitride region including a plurality of first nitride portions and a plurality of second nitride portions, one of the first nitride portions being between one of the second nitride portions and an other one of the second nitride portions in a stacking direction from the semiconductor member to the first electrode portion, a composition of the one of the first nitride portions being different from a composition of the one of the second nitride portions and different from a composition of the other one of the second nitride portions, wherein the nitride member further comprises one or more third nitride portions, the one or more third nitride portion is located between the one of the first nitride portions and the one of the second nitride portions in the stacking direction, and a composition of the one or more third nitride portions is different from the composition of the one of the first nitride portions, and is different from the composition of the other one of the second nitride portions.

2. The device according to claim 1, wherein the one of the second nitride portions is located between the one of the first nitride portions and an other one of the first nitride portions, a composition of the other one of the first nitride portions is different from the composition of the one of the second nitride portions, and different from the composition of the other one of the second nitride portions.

3. The device according to claim 1, wherein in the first nitride region, the stacking direction is along the second direction.

4. The device according to claim 1, wherein the one of the first nitride portions includes $In_{y1}Al_{z1}Ga_{1-y1-z1}N$ ($0 \le y1 \le 1$, $0 \le z1 \le 1$, $y1+z1 \le 1$), and the one of the second nitride portions includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ne z1$).

5. The device according to claim 1, wherein an average composition of the nitride member is $In_\alpha Al_\beta Ga_{1-\alpha-\beta}N$ ($0 \le \alpha \le 1$, $0 \le \beta \le 1$, $\alpha+\beta \le 1$), and the $\alpha$ and $\beta$ satisfy:

$$2.207 \times \alpha \le \beta \le 1.92 \times \alpha + 0.394.$$

6. The device according to claim 1, wherein each of the first nitride portions includes $In_{y1}Al_{z1}Ga_{1-y1-z1}N$ ($0 \le y1 \le 1$, $0 \le z1 \le 1$, $y1+z1 \le 1$), each of the second nitride portions includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ne z1$), each of the first nitride portions has a first thickness t1 along the stacking direction, each of the second nitride portions has a second thickness t2 along the stacking direction, a number of the first nitride portions is n1 (n1 is an integer not less than 2), a number of the second nitride portions is n2 (n2 is an integer not less than 2), an average composition of the nitride member is $In_\alpha Al_\beta Ga_{1-\alpha-\beta}N$ ($0 \le \alpha \le 1$, $0 \le \beta \le 1$, $\alpha+\beta \le 1$), the $\alpha$ is $(t1 \times y1 \times n1 + t2 \times y2 \times n2)/(t1 \times n1 + t2 \times n2)$, the $\beta$ is $(t1 \times z1 \times n1 + t2 \times z2 \times n2)/(t1 \times n1 + t2 \times n2)$, and the $\alpha$ and the $\beta$ satisfy:

$$2.207 \times \alpha \le \beta \le 1.92 \times \alpha + 0.394.$$

7. The device according to claim 6, wherein the x1 is less than 0.1.

8. The device according to claim 1, wherein, each of the first nitride portions includes $In_{y1}Al_{z1}Ga_{1-y1-z1}N$ ($0 \le y1 \le 1$, $0 \le z1 \le 1$, $y1+z1 \le 1$), each of the second nitride portions includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ne z1$), each of the first nitride portions has a first thickness t1 along the stacking direction, each of the second nitride portions has a second thickness t2 along the stacking direction, a number of the first nitride portions is n1 (n1 is an integer not less than 2), and a number of the second nitride portions is n2 (n2 is an integer not less than 2), an average composition of the nitride member is $In_\alpha Al_\beta Ga_{1-\alpha-\beta}N$ ($0 \le \alpha \le 1$, $0 \le \beta \le 1$, $\alpha+\beta \le 1$), the $\alpha$ is $(t1 \times y1 \times n1 + t2 \times y2 \times n2)/(t1 \times n1 + t2 \times n2)$, the $\beta$ is $(t1 \times z1 \times n1 + t2 \times z2 \times n2)/(t1 \times n1 + t2 \times n2)$, and the $\alpha$ and the $\beta$ satisfy:

$$2.207 \times \alpha \le \beta \le 2.204 \times \alpha + 0.212.$$

9. The device according to claim 1, wherein each of the first nitride portions includes $In_{y1}Al_{z1}Ga_{1-y1-z1}N$ ($0 \le y1 \le 1$, $0 \le z1 \le 1$, $y1+z1 \le 1$), each of the second nitride portions includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ne z1$), each of the one or more third nitride portions includes $In_{y3}Al_{z3}Ga_{1-y3-z3}N$ ($0 \le y3 \le 1$, $0 \le z3 \le 1$, $y3+z3 \le 1$, $y3 \ne y1$, $y3 \ne y2$, $z3 \ne z1$, $z3 \ne z2$), each of the first nitride portions has a first thickness t1 along the stacking direction, each of the second nitride portions has a second thickness t2 along the stacking direction, each of the one or more third nitride portions has a third thickness t3 along the stacking direction, a number of the first nitride portions is n1 (n1 is an integer not less than 2), a number of the second nitride portions is n2 (n2 is an integer not less than 2), a number of the one or more third nitride portions is n3 (n3 is an integer not less than 1), an average composition of the nitride member is $In_\alpha Al_\beta Ga_{1-\alpha-\beta}N$ ($0 \le \alpha \le 1$, $0 \le \beta \le 1$, $\alpha+\beta \le 1$), the $\alpha$ is $(t1 \times y1 \times n1 + t2 \times y2 \times n2 + t3 \times y3 \times n3)/(t1 \times n1 + t2 \times n2 + t3 \times n3)$, the $\beta$ is $(t1 \times z1 \times n1 + t2 \times z2 \times n2 + t3 \times z3 \times n3)/(t1 \times n1 + t2 \times n2 + t3 \times n3)$, and the $\alpha$ and the $\beta$ satisfy:

$$2.207 \times \alpha \le \beta \le 1.92 \times \alpha + 0.394.$$

10. The device according to claim 1, wherein each of the first nitride portions includes $In_{y1}Al_{z1}Ga_{1-y1-z1}N$ ($0 \le y1 \le 1$, $0 \le z1 \le 1$, $y1+z1 \le 1$), each of the second nitride portions includes $In_{y2}Al_{z2}Ga_{1-y2-z2}N$ ($0 \le y2 \le 1$, $0 \le z2 \le 1$, $y2+z2 \le 1$, $y2 \ne y1$, $z2 \ne z1$), each of the one or more third nitride portions includes $In_{y3}Al_{z3}Ga_{1-y3-z3}N$ ($0 \le y3 \le 1$, $0 \le z3 \le 1$, $y3+z3 \le 1$, $y3 \ne y1$, $y3 \ne y2$, $z3 \ne z1$, $z3 \ne z2$), each of the first nitride portions has a first thickness t1 along the stacking direction, each of the second nitride portions has a second thickness t2 along the stacking direction, each of the one or more third nitride portions has a third thickness t3 along the stacking direction, a number of the first nitride portions is n1 (n1 is an integer not less than 2), a number of the second nitride portions is n2 (n2 is an integer not less than 2), a number of the one or more third nitride portions is n3 (n3 is an integer not less than 1), an average composition of the nitride member is $In_\alpha Al_\beta Ga_{1-\alpha-\beta}N$ ($0 \le \alpha \le 1$, $0 \le \beta \le 1$), $\alpha+\beta \le 1$), the $\alpha$ is $(t1 \times y1 \times n1 + t2 \times y2 \times n2 + t3 \times y3 \times n3)/(t1 \times n1 + t2 \times n2 + t3 \times n3)$, the $\beta$ is $(t1 \times z1 \times n1 + t2 \times z2 \times n2 + t3 \times z3 \times n3)/(t1 \times n1 + t2 \times n2 + t3 \times n3)$, and the $\alpha$ and the $\beta$ satisfy:

$$2.207 \times \alpha \le \beta \le 2.204 \times \alpha + 0.212.$$

11. The device according to claim 1, wherein a thickness of each of the first nitride portions is not less than 0.1 nm and not more than 5 nm, and a thickness of each of the second nitride portions is not less than 0.1 nm and not more than 5 nm.

12. The device according to claim 1, wherein a crystal lattice in the first nitride region is continuous with a crystal lattice in the third partial region.

13. The device according to claim 1, wherein the first insulating member includes a second insulating region and a third insulating region, at least a part of the second insulating region is between the first semiconductor portion and the first electrode portion in the first direction, at least a part of the third insulating region is between the first electrode portion and the second semiconductor portion in the first direction, the nitride member includes a second nitride region and a third nitride region, at least a part of the second nitride region is between the first semiconductor portion and the at least part of the second insulating region in the first direction, and at least a part of the third nitride region is between the at least part of the third insulating region and the second semiconductor portion in the first direction.

14. The device according to claim 13, wherein the nitride member includes a fourth nitride region and a fifth nitride region, the first semiconductor portion is located between the fourth partial region and the fourth nitride region in the second direction, and the second semiconductor portion is located between the fifth partial region and the fifth nitride region in the second direction.

15. The device according to claim 13, wherein in the second nitride region, the stacking direction is along the first direction, and in the third nitride region, the stacking direction is along the first direction.

16. The device according to claim 1, further comprising a second insulating member including a first insulating portion and a second insulating portion, the first semiconductor portion being located between the fourth partial region and the first insulating portion in the second direction, the second semiconductor portion being located between the fifth partial region and the second insulating portion in the second direction, the first insulating member comprising silicon and oxygen, the second insulating member comprising silicon and nitrogen, the first insulating member not comprising nitrogen, or a concentration of nitrogen in the first insulating member being lower than a concentration of nitrogen in the second insulating member, and the second insulating member not comprising oxygen, or a concentration of oxygen in the second insulating member being lower than a concentration of oxygen in the first insulating member.

17. The device according to claim 1, wherein a part of the first electrode portion is located between the fourth partial region and the fifth partial region in the first direction.

18. The device according to claim 1, wherein an other part of the first electrode portion is between the first semiconductor portion and the second semiconductor portion in the first direction.

* * * * *